(12) United States Patent
Jun et al.

(10) Patent No.: US 6,959,823 B2
(45) Date of Patent: Nov. 1, 2005

(54) WAFER GUIDES FOR PROCESSING SEMICONDUCTOR SUBSTRATES

(75) Inventors: Pil-Kwon Jun, Yongin-si (KR);
Sang-oh Park, Seongnam-si (KR);
Yong-Kyun Ko, Osan-si (KR);
Hun-Jung Yi, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 24 days.

(21) Appl. No.: 10/619,999

(22) Filed: Jul. 14, 2003

(65) Prior Publication Data

US 2004/0045865 A1  Mar. 11, 2004

(30) Foreign Application Priority Data

Sep. 6, 2002  (KR)  ...................... 10-2002-0053755

(51) Int. Cl.$^7$ ........................................... A47G 19/08
(52) U.S. Cl. .................................. 211/41.18
(58) Field of Search .............................. 211/41.18, 40, 211/41.1, 42, 43, 41.2; 206/710–712, 454, 206/832; 432/258, 259; 414/935

(56) References Cited

U.S. PATENT DOCUMENTS

| | | | |
|---|---|---|---|
| 1,480,043 A * | 1/1924 | Blakeslee | 211/41.2 |
| 2,338,290 A * | 1/1944 | McDonald | 211/41.2 |
| 4,355,974 A * | 10/1982 | Lee | 432/253 |
| 4,566,839 A * | 1/1986 | Butler | 414/404 |
| 4,568,234 A * | 2/1986 | Lee et al. | 414/404 |
| 4,573,851 A * | 3/1986 | Butler | 414/404 |
| 4,611,966 A * | 9/1986 | Johnson | 414/404 |
| 4,733,781 A * | 3/1988 | Gerlach | 211/85.8 |
| 4,969,560 A * | 11/1990 | Stanfield | 211/41.2 |
| 4,981,222 A * | 1/1991 | Lee | 211/41.18 |
| 4,993,559 A * | 2/1991 | Cota | 211/41.18 |
| 5,025,926 A * | 6/1991 | Gregerson et al. | 206/711 |
| 5,046,615 A * | 9/1991 | Nentl et al. | 206/454 |
| 5,228,568 A * | 7/1993 | Ogino et al. | 206/711 |
| 5,332,105 A * | 7/1994 | Stanfield | 211/41.4 |
| 5,706,946 A * | 1/1998 | Kakizaki et al. | 206/454 |
| 6,318,389 B1 * | 11/2001 | Schmidt et al. | 134/201 |
| 6,520,191 B1 * | 2/2003 | Iwamoto et al. | 134/184 |
| 6,571,964 B2 * | 6/2003 | Jacobson et al. | 211/41.12 |
| 2003/0085186 A1 * | 5/2003 | Fujioka et al. | 211/41.18 |
| 2004/0022607 A1 * | 2/2004 | Lim et al. | 414/222.01 |

FOREIGN PATENT DOCUMENTS

| | | | | |
|---|---|---|---|---|
| KR | 20-0148627 | 3/1998 | ........... | H01L 21/68 |
| KR | 1998-081033 | 11/1998 | ......... | H01L 21/302 |
| KR | 1999-0045385 | 6/1999 | ......... | H01L 21/304 |

OTHER PUBLICATIONS

English Abstract Only.

*Primary Examiner*—Jennifer E. Novosad
(74) *Attorney, Agent, or Firm*—F. Chau & Associates, LLC

(57) ABSTRACT

A wafer guide includes a horizontal support panel and at least three vertical panels attached on one surface of the support panel. Each of the vertical panels has a vertical body panel and a plurality of protrusions upwardly extended from a top surface of the vertical body panel. Gap regions between the protrusions act as slots for holding wafers. Sidewalls of the slots have a convex shaped profile when viewed from a top view, and bottom surfaces of the slots also have a convex shaped profile when viewed from a cross sectional view that crosses the vertical panels.

5 Claims, 18 Drawing Sheets

WAFER GUIDES FOR PROCESSING SEMICONDUCTOR SUBSTRATES

CROSS-REFERENCE TO RELATED APPLICATION

This application claims priority to Korean Patent Application No. 2002-53755, filed on Sep. 6, 2002, the contents of which are herein incorporated by reference in their entirety.

BACKGROUND OF THE INVENTION

1. Field of the Invention

The present invention relates to a cleaning/drying apparatus and, more particularly, to wafer guides for holding semiconductor substrates.

2. Description of Related Art

A wet process, such as a wet cleaning process or a wet etching process, is frequently used in fabricating semiconductor devices. Semiconductor substrates, e.g., semiconductor wafers, are dipped into a chemical solution to perform the wet process. A portion of the chemical solution may remain on the semiconductor wafers even after finishing the wet process. The remaining chemical solution is removed by a rinse process. The rinse process is typically performed using de-ionized (DI) water. The DI water on the wafers is removed by a drying process.

A wafer guide holds the wafers during the wet processes, the rinse process, and the drying process. That is, the wafers are inserted into slots of the wafer guide. As a result, the wafers are in contact with the wafer guide. Accordingly, even though the drying process is performed, the DI water around contact points between the wafer guide and the wafers may not be removed. The DI water remaining on the wafers after the drying process generates surface defects called "water spots". The water spots substantially reduce the yield of the semiconductor devices from the wafers. Therefore, there is a need to decrease the contact areas between the wafers and the wafer guide.

The slots of the wafer guide have widths greater than the thickness of the wafers. The width of the slots prevent scratches from being formed on the surfaces of the wafers when the wafers are loaded into the slots. Each of the wafers loaded in the slots randomly inclines to one side and therefore, spaces between the wafers are irregular. In particular, when the spaces between the front surfaces of the adjacent wafers are non-uniform, the drying efficiency of the drying process is substantially reduced.

SUMMARY OF THE INVENTION

According to an embodiment of the present invention, wafer guides improve the drying efficiency of a drying process for semiconductor wafers.

According to an embodiment of the present invention, wafer guides reduce the size of the contact areas between the semiconductor wafers and the wafer guides.

According to an embodiment of the present invention, wafer guides uniformly control the spaces between the semiconductor wafers.

To achieve the features and other advantages of the present invention, wafer guides according to an embodiment of the present invention are used in a wet process and a drying process.

According to an embodiment of the present invention, the wafer guide comprises a support panel and at least three vertical panels attached on one surface of the support panel. The vertical panels are parallel to each other and perpendicular to the support panel. Each of the vertical panels has a vertical body panel and a plurality of protrusions extending upwardly from a top surface of the vertical body panel. The protrusions define a plurality of slots. Sidewalls of the slots have convex shapes when viewed from a top view, and a bottom surface of each slot has a convex shape when viewed from a cross sectional view passing through the slot between the protrusions.

The at least three vertical panels may comprise a first vertical panel and a second vertical panel, which are attached on both edges of the support panel respectively, and a central panel located between the first and second vertical panels. It is preferable that the bottom surfaces of the slots in the central panel have asymmetrical profiles with respect to the plane that passes through a central point of the central panel and is parallel to the central panel.

According to another embodiment of the invention, the wafer guide includes a support panel and at least three vertical panels attached on one surface of the support panel. The vertical panels are parallel to each other and perpendicular to the support panel. Each of the vertical panels has a vertical body panel and a plurality of protrusions extending upwardly from a top surface of the vertical body panel to define a plurality of slots. The protrusions comprise a hydrophobic material, and the body panels comprise a hydrophilic material.

Each of the bottom surfaces of the slots preferably has a recessed groove to reduce a contact area between the bottom surface of the slot and a semiconductor wafer inserted into the slot. Further, it is preferable that sidewalls of the slots have convex shapes when viewed from a top view.

According to still another embodiment of the invention, the wafer guide includes a support panel and at least three vertical panels attached on one surface of the support panel. The vertical panels are parallel to each other and perpendicular to the support panel. Each of the vertical panels has a vertical body panel and a plurality of protrusions extending upwardly from a top surface of the body panel to define a plurality of slots. The protrusions comprise a first set of protrusions interleaved with a second set of protrusions. Sidewalls of the protrusions comprise vertical lower sidewalls defining lower widths of the slots and positive sloped upper sidewalls extended from the lower sidewalls. The lower sidewalls of the second set of protrusions are higher or lower than the lower sidewalls of the first set of protrusions.

The lower sidewalls of the protrusions may have convex shapes when viewed from a top view. Also, the bottom surface of each the slot may have a convex shape when viewed from cross sectional view that passes through the slot between the protrusions.

The at least three vertical panels may comprise a first vertical panel and a second vertical panel, which are attached on both edges of the support panel respectively, and a central panel located between the first and second vertical panels. In this case, it is preferable that the bottom surfaces of the slots in the central panel have asymmetrical profiles with respect to the plane that passes through a central point of the central panel and is parallel to the central panel.

According to still another embodiment of the present invention, the wafer guide includes a support panel and at least three vertical panels attached on one surface of the support panel. The vertical panels are parallel to each other and perpendicular to the support panel. Each of the vertical panels has a vertical body panel and a plurality of protrusions extending upwardly from a top surface of the vertical body panel to define a plurality of slots. The protrusions comprise a first set of protrusions interleaved with a second set of protrusions. Sidewalls of the protrusions comprise lower sidewalls defining lower widths of the slots and positive sloped upper sidewalls extended from the lower sidewalls. The lower sidewalls of the second set of protrusions have vertical profiles, and the lower sidewalls of the first set of protrusions have positive slopes, which are steeper than the upper sidewalls.

The vertical lower sidewalls may have the same height as the sloped lower sidewalls. The vertical lower sidewalls and the sloped lower sidewalls may have convex shapes when viewed from a top view. A bottom surface of each slot may have a convex shape when viewed from cross sectional view that passes through the slot between the protrusions.

Further, the at least three vertical panels may comprise a first vertical panel and a second vertical panel, which are attached on both edges of the support panel respectively, and a central panel located between the first and second vertical panels. In this case, it is preferable that the bottom surfaces of the slots in the central panel have asymmetrical profiles with respect to the plane that passes through a central point of the central panel and is parallel to the central panel.

According to still another embodiment of the invention, the wafer guide includes a support panel and at least three vertical panels attached on one surface of the support panel. The vertical panels are parallel to each other and perpendicular to the support panel. Each of the vertical panels has a vertical body panel and a plurality of protrusions extending upwardly from a top surface of the vertical body panel to define a plurality of slots. The slots comprise a first set of slots and a second set of slots. When viewed from a cross sectional view which is taken along the plane that parallel to the vertical panels, the bottom surfaces of the first set of slots have the opposite slope to the bottom surfaces of the second set of slots.

Sidewalls of the protrusions may comprise vertical lower sidewalls defining lower widths of the slots and positive sloped upper sidewalls extended from the vertical lower sidewalls. It is preferable that the vertical lower sidewalls have convex shapes when viewed from a top view. The bottom surfaces of the slots may have convex shapes when viewed from cross sectional views that pass through the slots between the protrusions.

Further, the at least three vertical panels may comprise a first vertical panel and a second vertical panel, which are attached on both edges of the support panel respectively, and a central panel located between the first and second vertical panels. In this case, it is preferable that the bottom surfaces of the slots in the central panel have asymmetrical profiles with respect to the plane that passes through a central point of the central panel and is parallel to the central panel.

According to still another embodiment of the present invention, a wafer guide comprises a main wafer guide for holding semiconductor wafers and an auxiliary wafer guide having a wider width than the main wafer guide. The auxiliary wafer guide includes an auxiliary supporter that is wider than the main wafer guide and a pair of parallel wafer supporters that are disposed on about both edges of the auxiliary supporter to additionally hold the semiconductor wafers.

The auxiliary wafer guide is physically connected to the main wafer guide. Thus, the auxiliary wafer guide is moved together with the main wafer guide. Alternatively, the auxiliary wafer guide may be separated from the main wafer guide.

Each of the wafer supporters is fixed by vertical bars, which are extended from both ends of the wafer supporter to be in contact with the auxiliary supporter. Therefore, a space is provided under the respective wafer supporters. As a result, fluid, which is introduced into gap regions between the wafers along a horizontal direction, flows from the outside of the auxiliary wafer guide through the space under the respective wafer supporters. The fluid uniformly flows about the surfaces of the wafers due to the presence of the spaces under the wafer supporters.

Each wafer supporter comprises a horizontal body having a first sidewall and a second sidewall that face each other and a plurality of protrusions that protruded from one of the first and second sidewalls. Spaces between the protrusions define a plurality of lumbar regions, which are in contact with the edge regions of the wafers. Each wafer supporter has a streamline shape when viewed from a cross sectional view that crosses the wafer supporter. Accordingly, in the event that fluid is introduced along the horizontal direction, which is perpendicular to the first and second sidewalls, whirlpool generation is suppressed.

Alternatively, each wafer supporter may comprise two sidebars and front/rear bars that connect the ends of the sidebars with each other. One of the sidebars is bent with a zigzag shape to provide a plurality of protrusions. Spaces between the protrusions define a plurality of lumbar regions, which are in contact with the edge regions of the wafers.

According to still another embodiment of the present invention, the wafer guide comprises a support panel and at least three vertical panels attached on one surface of the support panel. The vertical panels are parallel to each other and perpendicular to the support panel. One of the vertical panels is a central panel that passes through a central point of the support panel. Each of the vertical panels has a vertical body panel and a plurality of protrusions extending upwardly from a top surface of the vertical body panel. The protrusions define a plurality of slots. A plurality of wafers are inserted into the slots. An alignment tool is installed at the central panel. The alignment tool adjusts actual widths of the slots so that the wafers inserted in the slots are separated from each other by a substantially uniform space.

It is preferable that lower sidewalls of the protrusions have a vertical profile.

The alignment tool comprises a cylinder for providing a space in the central panel and a piston inserted in the cylinder. A first fluid inlet conduit and a second fluid inlet conduit are connected to both ends of the cylinder respectively. Thus, in the event that fluid is injected into the first fluid inlet conduit, the piston moves toward the second fluid inlet conduit. In the event that the fluid is injected into the second fluid inlet conduit, the piston moves toward the first fluid inlet conduit. A plurality of pads are physically connected to the piston. Each of the pads protrudes from the one sidewall of the respective protrusions or is retracted into the respective protrusions according to the movement of the piston. When the pads are protruded, the actual widths of the slots are reduced to squeeze the wafers, which are inserted into the slots. Therefore, the wafers are held substantially vertically. In the event that the protrusions have uniform pitches, the spaces between the wafers are substantially uniform.

Alternatively, the alignment tool may comprise a first rotational axis and a second rotational axis, which are installed at both sides of the central panel respectively. The rotational axes are installed to be parallel with a straight line that penetrates the protrusions of the central panel. The first rotational axis penetrates a first group of rollers. Similarly, the second rotational axis penetrates a second group of rollers. The first and second groups of rollers have the same pitch as the protrusions of the central panel. The first rollers and one of the second rollers are located at both sides of each of the protrusions respectively. The first rollers rotate with the first rotational axis, and the second rollers rotate with the second rotational axis. Each of the rollers includes a first edge region having a first thickness and a second edge region having a second thickness, which is greater than the first thickness. Thus, at least one of both sidewalls of the respective rollers has a sloped profile.

When the wafers are loaded or unloaded, the first and second rotational axes are rotated so that all of the first edge regions of the rollers are arrayed downward. In this case, the wafers inserted in the slots are not in contact with any of the rollers. However, if the first and second rotational axes are rotated so that all of the second edge regions of the rollers are arrayed upward, front surfaces or backside surfaces of the wafers in the slots are in contact with the second edge regions. As a result, the wafers are squeezed and held substantially vertically.

BRIEF DESCRIPTION OF THE DRAWINGS

Other features and advantages of the present invention will be more readily understood from the following detailed description of specific embodiments thereof when read in conjunction with the accompanying drawings, in which.

DETAILED DESCRIPTION OF PREFERRED EMBODIMENTS

Figure 1:
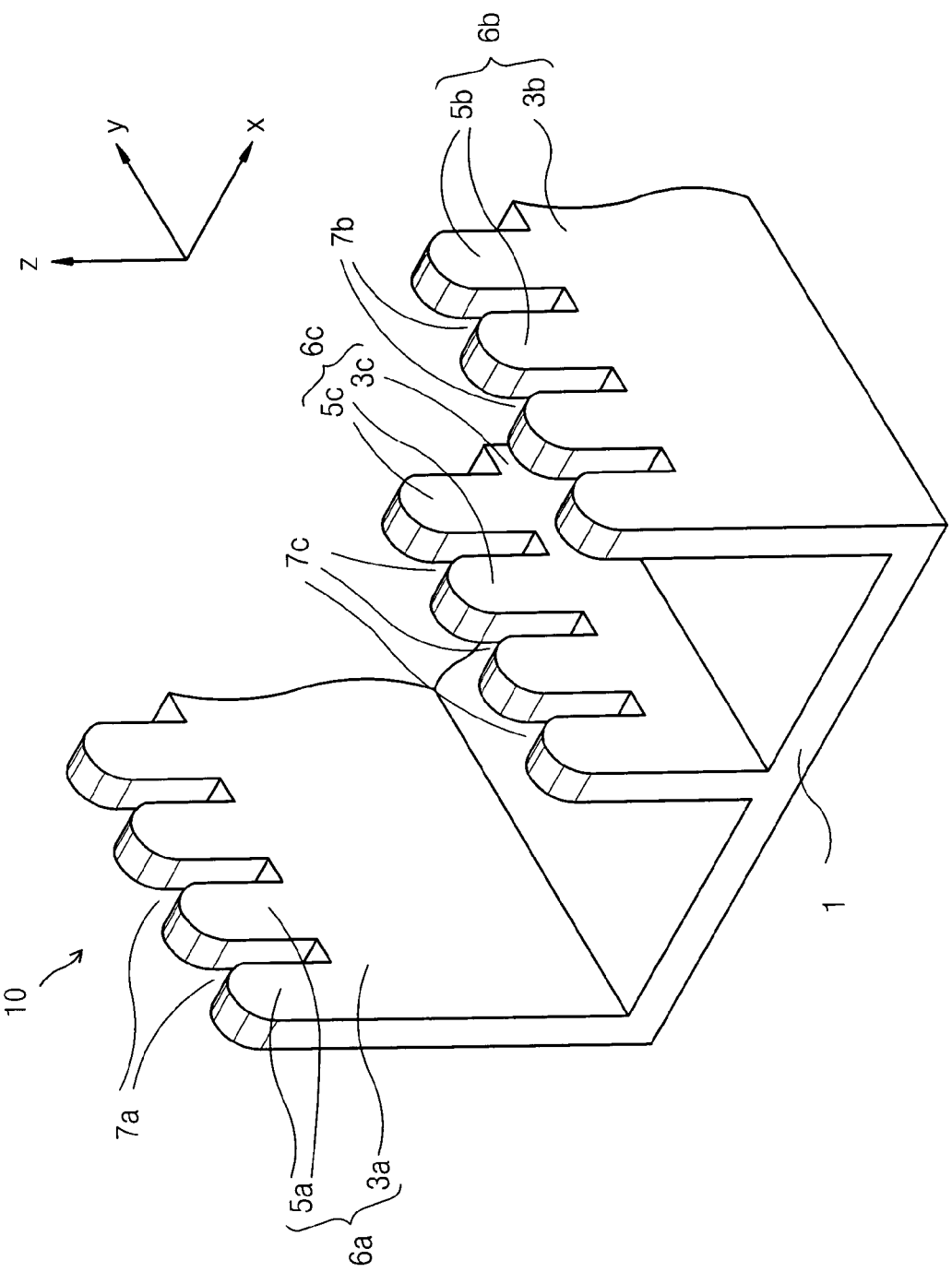
FIG. 1 is a perspective view illustrating a wafer guide according to an embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the dimensions of elements are exaggerated for clarity. Like numbers refer to like elements throughout the specification.

FIG. 1 is a perspective view illustrating a wafer guide according to an embodiment of the present invention.

Referring to FIG. 1, the wafer guide 10 comprises a support panel 1, a first vertical panel 6a and a second vertical panel 6b located on both edges of the support panel 1 respectively, and a central panel 6c located between the first vertical panel 6a and the second vertical panel 6b. The central panel 6c is disposed on a central region of the support panel 1 and is parallel with the first vertical panel 6a and the second vertical panel 6b. The first vertical panel 6a comprises a first body panel 3a and a plurality of first protrusions 5a upwardly extended from a top surface of the first body panel 3a. The first protrusions 5a define a plurality of first slots 7a that correspond to the gap regions between the first protrusions 5a. Similarly, the second vertical panel 6b comprises a second body panel 3b and a plurality of second protrusions 5b upwardly extended from a top surface of the second body panel 3b. The second protrusions 5b define a plurality of second slots 7b that correspond to the gap regions between the second protrusions 5b. In addition, the central panel 6c includes a central body panel 3c and a plurality of central protrusions 5c upwardly extended from a top surface of the central body panel 3c. The gap regions between the central protrusions 5c correspond to central slots 7c. A plurality of wafers are inserted into the slots 7a, 7b and 7c. The central slots 7c are located at a lower level than the first slots 7a and the second slots 7b. The level difference between the first slots 7a and the second slots 7b and the central slots 7c correspond to a diameter of the wafers.

Figure 24:
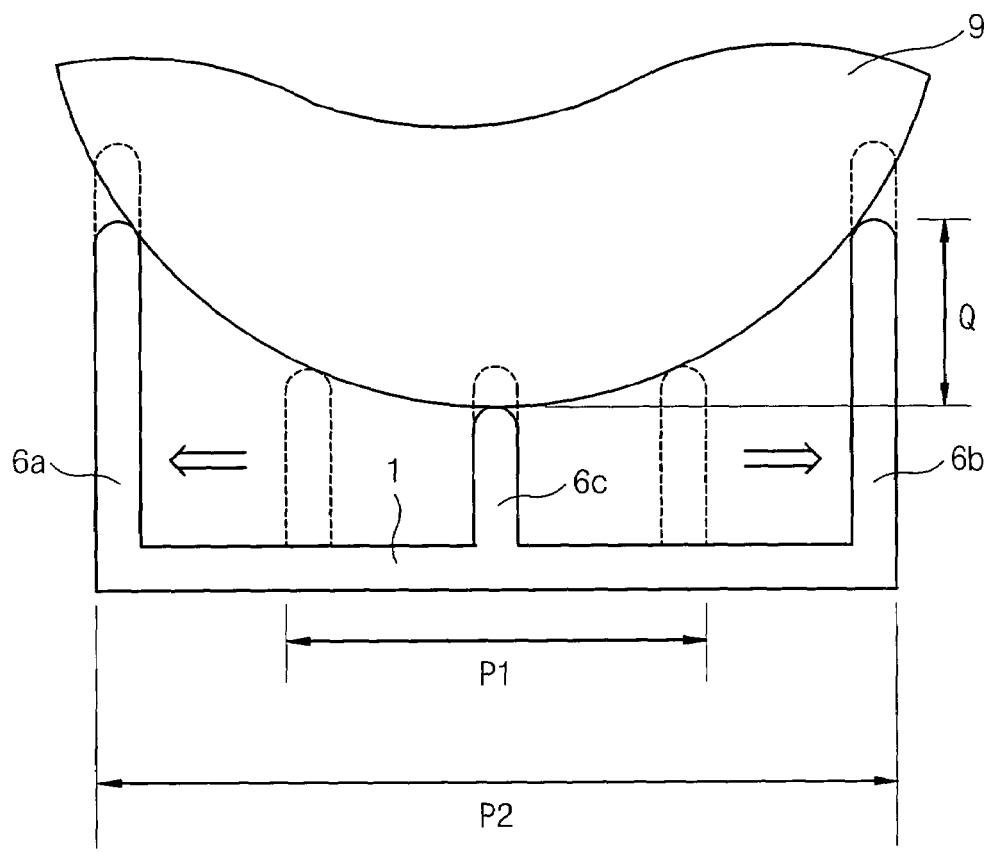
FIG. 24 is a front view illustrating an embodiment of the wafer guide shown in FIG. 1.

A pitch size of the slots 7a, 7b and 7c is reduced to increase a batch size of the wafers, which are treated during a single rinse/dry process. For example, in the event that the pitch size of the slots 7a, 7b and 7c is reduced from 10 mm to 5 mm, the number of wafers that can be loaded into the wafer guide doubles. In addition, throughput increases as the diameter of the wafers increases. Wafers having a diameter of 300 mm have been widely used as an alternative to wafers having a diameter of 200 mm. As wafer size increases, the probability that upper regions of adjacent wafers will contact each other due to the reduction of the pitch of the slots increases. Thus, the space between the first vertical panel 6a and the second vertical panel 6b is preferably increased from P1 to P2 as shown in FIG. 24, thereby preventing the wafers from coming into contact with each other. It is preferable that the width of the support panel 1 corresponds to the diameter of the wafer. The heights of the first slots 6a and second slots 6b are increased as the width of the support panel 1 increases in order that bottom surfaces of the central slots 7c as well as bottom surfaces of the first slots 7a and the second slots 7b are in uniform contact with the wafers inserted into the slots 7a, 7b and 7c. For example, when the pitch of the slots is 7 mm and the diameter of the wafers is 300 mm, it is preferable that the level difference (Q of FIG. 24) between the first slots 7a and the second slots 7b and the central slots 7c is at least 57 mm.

Figure 2:
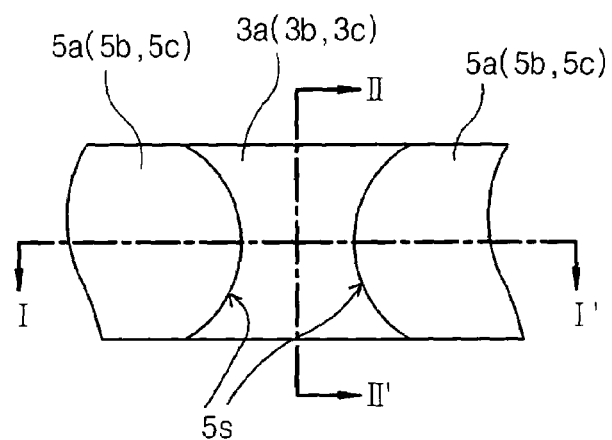
FIG. 2 is a top view illustrating a portion of a vertical panel of the wafer guide shown in FIG. 1.

FIG. 2 is a top view illustrating a portion of the first vertical panel 6a, the second vertical panel 6b or the central panel 6c.

Referring to FIG. 2, sidewalls 5s of the protrusions 5a, 5b and 5c have a convex shape when viewed from a top view that is taken along the x-y plane of FIG. 1. Thus, in the event that the wafers are loaded into the slots (e.g., 7a, 7b and 7c of FIG. 1) between the protrusions 5a, 5b and 5c, it is possible to reduce contact areas between the wafers and the sidewalls 5s.

Figure 3:
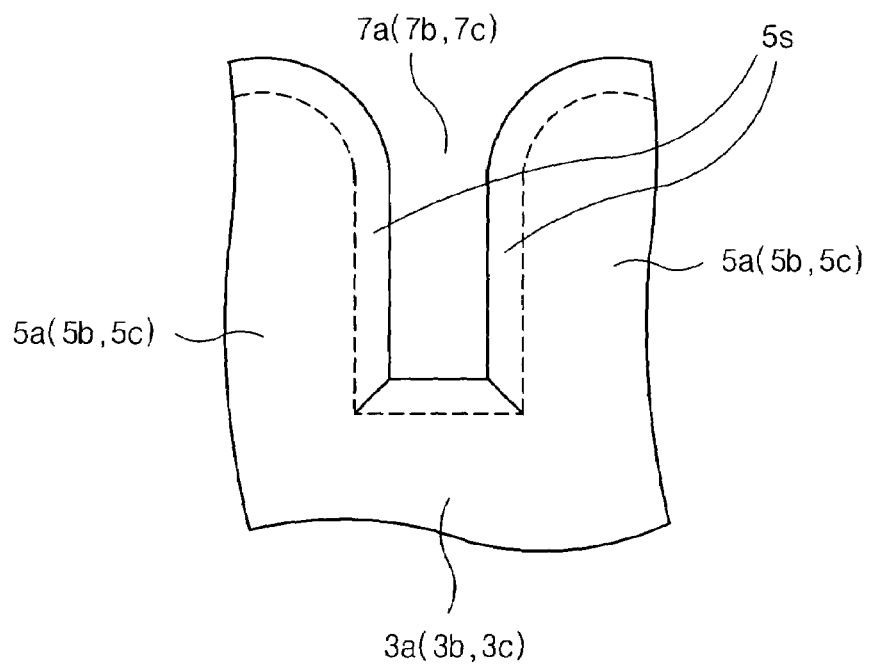
FIG. 3 is a cross sectional view taken along the line I–I' of FIG. 2.

FIG. 3 is a side sectional view taken along the line I–I' of FIG. 2.

Referring to FIG. 3, top surfaces of the protrusions 5a, 5b and 5c are convex-shaped when viewed from a cross sectional view that is parallel to the y-z plane of FIG. 1. Accordingly, when the wafers are loaded onto the wafer guide (10 of FIG. 1), the wafers are inserted in the slots 7a, 7b and 7c.

Figure 4:
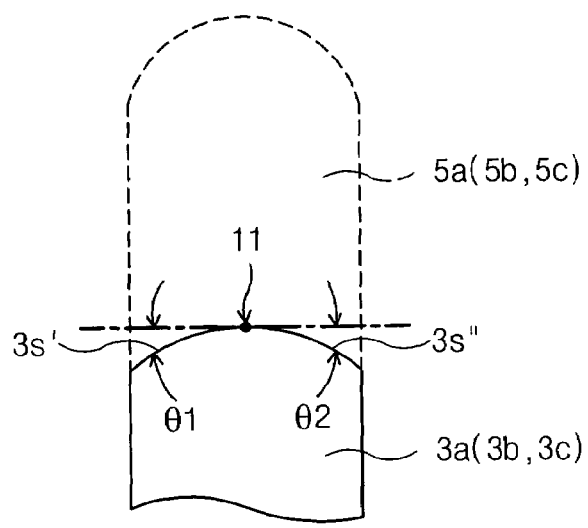
FIG. 4 is a cross sectional view taken along the line II–II' of FIG. 2.

FIG. 4 is a front sectional view taken along the line II–II' of FIG. 2.

Referring to FIG. 4, bottom surfaces of the slots 7a, 7b and 7c have a convex shape when viewed from a cross sectional view that is parallel to the x-z plane of FIG. 1. Therefore, each of the bottom surfaces of the slots 7a, 7b and 7c is in contact with a tangent line parallel to the x-axis of FIG. 1 at a single contact point 11. As a result, each bottom surface is divided into a first bottom surface 3s' and a second bottom surface 3s", which are located at both sides of the contact point 11 respectively. The first bottom surface 3s' and the second bottom surface 3s" have a symmetrical profile to each other with respect to the plane that is parallel to the y-z plane of FIG. 1 and passes through the contact point 11. A first angle θ1 between the first bottom surface 3s' and the tangent line is substantially identical to a second angle θ2 between the second bottom surface 3s" and the tangent line.

The bottom surfaces of the slots 7a, 7b and 7c may have asymmetrical surface profiles. It is preferable that the bottom surfaces of the central slots 7c have asymmetrical profiles as shown in FIG. 5.

Figure 5:
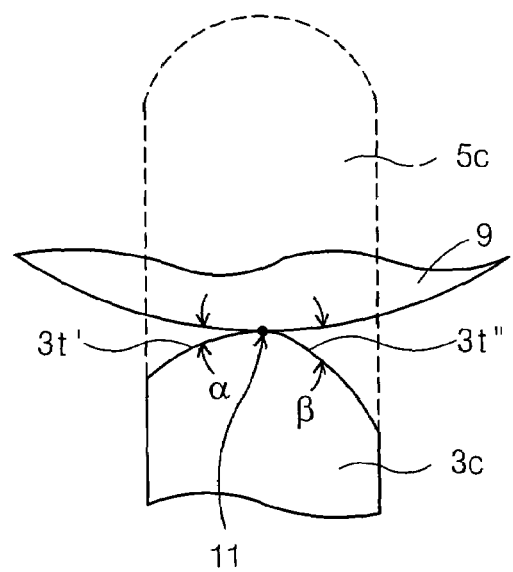
FIG. 5 is another cross sectional view taken along the line II–II' of FIG. 2.

Referring to FIG. 5, each bottom surface of the central slots 7c is in contact with a semiconductor wafer 9 at the contact point 11. Thus, each bottom surface is divided into a first bottom surface 3t' and a second bottom surface 3t", which are located at both sides of the contact point 11 respectively. Here, a slope, or a curvature, of the first bottom surface 3t' is different from a slope of the second bottom surface 3t". For example, a first angle α between the wafer 9 and the first bottom surface 3t' is less than a second angle β between the wafer 9 and the second bottom surface 3t" as shown in FIG. 5. During the drying process for removing de-ionized water on the wafer 9, the de-ionized water existing between the second bottom surface 3t" and the wafer 9 is substantially removed. This is because a surface tension of the de-ionized water between the second bottom surface 3t" and the wafer 9 is less than a surface tension of the de-ionized water between the first bottom surface 3t' and the wafer 9. The surface tension difference is due to the difference between a first angle α and a second angle β. As a result, it is possible to improve the drying efficiency of the wafer 9. Alternatively, the first angle α may be greater than the second angle β.

Figure 6:
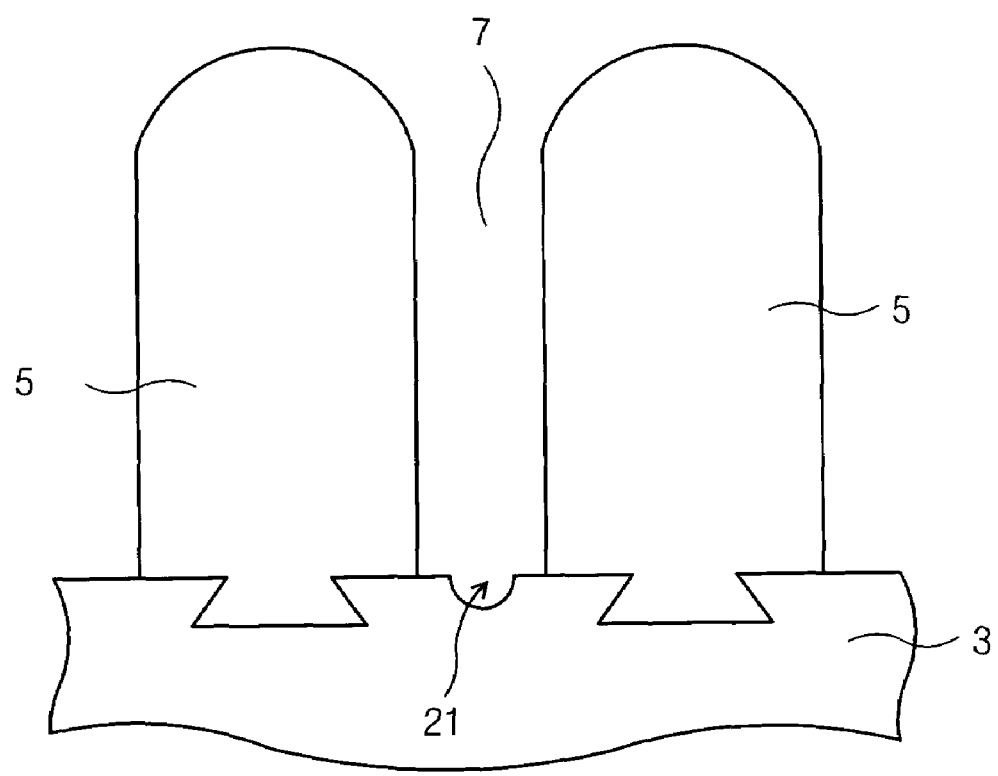
FIG. 6 is a side cross sectional view illustrating a portion of vertical panels of the wafer guide according to an embodiment of the present invention.

FIG. 6 is a cross sectional view illustrating vertical panels of the wafer guide according to an embodiment of the invention. FIG. 6 is the cross sectional view taken along the plane that is parallel to the y-z plane of FIG. 1.

Referring to FIG. 6, each of the vertical panels of the wafer guide comprises vertical body panel 3 and a plurality of protrusions 5 attached on the top surface of the body panel 3. The gap regions between the protrusions 5 act as slots 7 in which wafers are inserted. The body panel 3 comprises a hydrophilic material, and the protrusions 5 comprise a hydrophobic material. For example, the body panel 3 may comprise quartz, and the protrusions 5 may comprise a fluorine system polymer. Thus, the de-ionized water existing between the wafers in the slots 7 and the protrusions 5 flows down toward the body panel 3. As a result, the drying efficiency is improved.

In addition, each of the bottom surfaces of the slots 7 preferably has a recessed groove 21. In this case, contact areas between the wafers and bottom surfaces of the slots 7 can be reduced because of the presence of the groove 21. Accordingly, the drying efficiency can be improved.

Further, sidewalls of the protrusions 5 (e.g., sidewalls of the slots 7) may have convex shape when viewed from a top view. Therefore, it is possible to reduce the size of the contact areas between the wafers in the slots 7 and the sidewalls of the protrusions 5. Thus, the drying efficiency can be improved.

Figure 7:
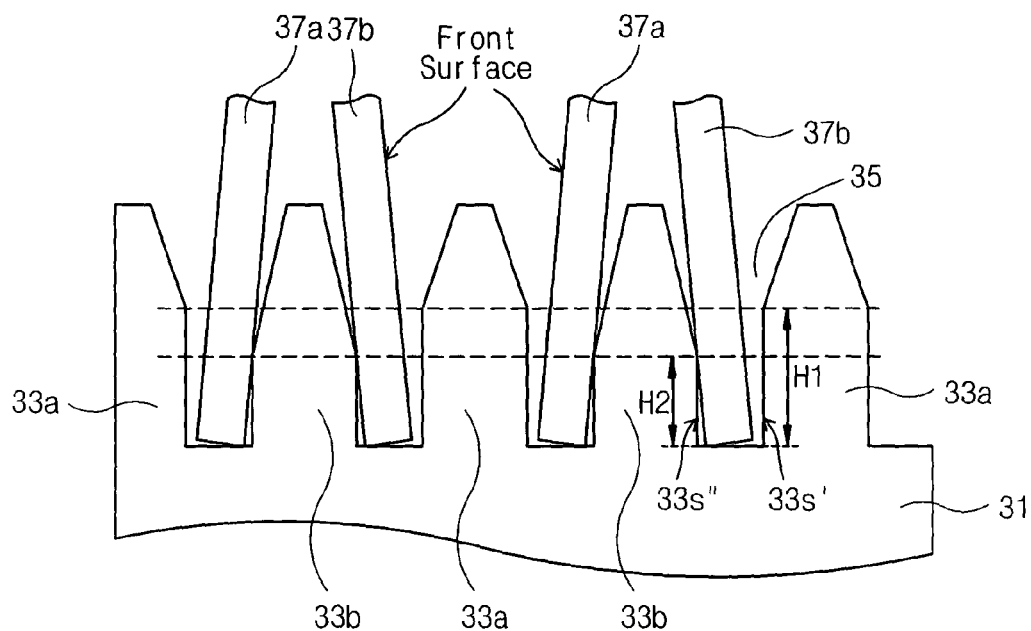
FIG. 7 is a side cross sectional view illustrating a portion of vertical panels of the wafer guide according to an embodiment of the present invention.

FIG. 7 is a cross sectional view illustrating vertical panels of the wafer guide according to an embodiment of the present invention. FIG. 7 is the cross sectional view taken along the plane that is parallel to the y-z plane of FIG. 1.

Referring to FIG. 7, each of the vertical panels comprises a vertical body panel 31 and a plurality of protrusions extended from a top surface of the body panel 31. The protrusions include a second set of protrusions 33a interleaved with a first set of protrusions 33b. Gap regions between the protrusions correspond to slots 35. Sidewalls of the protrusions include vertical lower sidewalls and positive sloped upper sidewalls. The vertical lower sidewalls define lower widths of the slots 35. Upper widths of the slots 35 are wider than the lower widths thereof. This is due to the positive sloped upper sidewalls.

A second set of protrusions 33a comprise first lower sidewalls 33s', and a first set of protrusions 33b comprise second lower sidewalls 33s". The height H1 of the first lower sidewalls 33s' is greater than the height H2 of the second lower sidewalls 33s". Thus, the wafers in the slots 35 may be inclined toward the first set of protrusions 33b. A first group of wafers 37a inserted in a second set of slots are inclined toward a right side as shown in FIG. 7. A second group of wafers 37b inserted in a first set of slots are inclined toward a left side as shown in FIG. 7. As a result, a space between the wafers 37a and 37b located at both sides of the respective second set of protrusions 33a becomes wider away from the vertical body panel 31. A space between the wafers 37a and 37b located at both sides of the respective first set of protrusions 33b becomes narrower away from the vertical body panel 31. Therefore, if the wafers are loaded so that front surfaces of the pair of wafers 37a and 37b located in both slots of the second set of protrusion 33a face to each other, the spaces between the front surfaces of the wafers are relatively wider than those between the backside surfaces of the wafers. Thus, fluid can be readily introduced into the gap regions between the front surfaces of the wafers during a rinsing or a drying process of the wafers. As a result, it is possible to improve a rinsing efficiency or a drying efficiency to the front surfaces of the wafers.

At least the lower sidewalls 33s' and 33s" may have a convex shape when viewed from a top view, for example, as shown in FIGS. 2 and 3. Also, bottom surfaces of the slots 35 may have a convex shape as shown in FIG. 4. In this case, it is possible to minimize the contact areas between wafers 37a and 37b and the vertical panels. Further, the bottom surfaces of the slots 35 may have an asymmetrical profile as explained with reference to FIG. 5.

Figure 8:
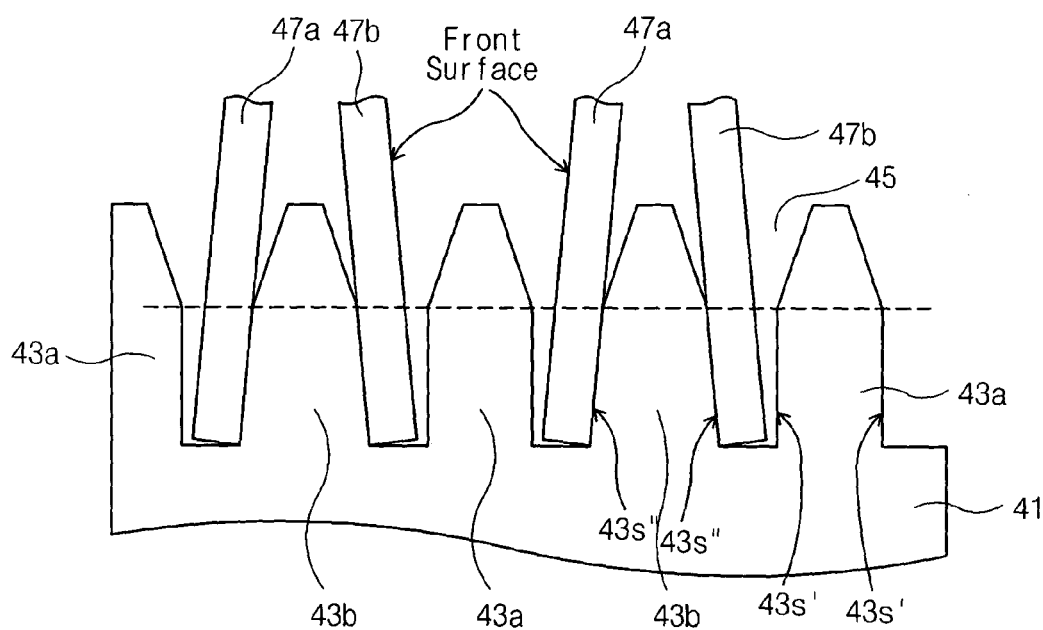
FIG. 8 is a side cross sectional view illustrating a portion of vertical panels of the wafer guide according to an embodiment of the present invention.

FIG. 8 is a cross sectional view illustrating vertical panels of the wafer guide according to an embodiment of the present invention.

Referring to FIG. 8, each of the vertical panels comprises a vertical body panel 41 and a plurality of protrusions extended from the top surface of the body panel 41. The protrusions include a second set of protrusions 43a interleaved with a first set of protrusions 43b. Gap regions between the protrusions correspond to slots 45. Sidewalls of the protrusions include lower sidewalls and positive sloped upper sidewalls. The lower sidewalls define lower widths of the slots 45. Upper widths of the slots 45 are wider than the lower widths thereof. This is due to the positive sloped upper sidewalls.

Lower sidewalls of the second set of protrusions 43a, e.g., a first lower sidewalls 43s', have a vertical profile, and lower sidewalls of the first set of protrusions 43b, e.g., a second lower sidewalls 43s", have a positive sloped profile. The second lower sidewalls 43s" have a steeper slope than the upper sidewalls. As a result, wafers 47a and 47b in the slots 45 may be inclined toward the a first set of protrusions 43b. Thus, it is possible to improve a rinsing efficiency or a drying efficiency to the front surfaces of the wafers.

Further, the lower sidewalls 43s' and 43s" may have a convex shape when viewed from a top view, for example, as shown in FIGS. 2 and 3. Also, the bottom surfaces of the slots 45 may have a surface profile as shown in FIGS. 4 and 5.

Figure 9:
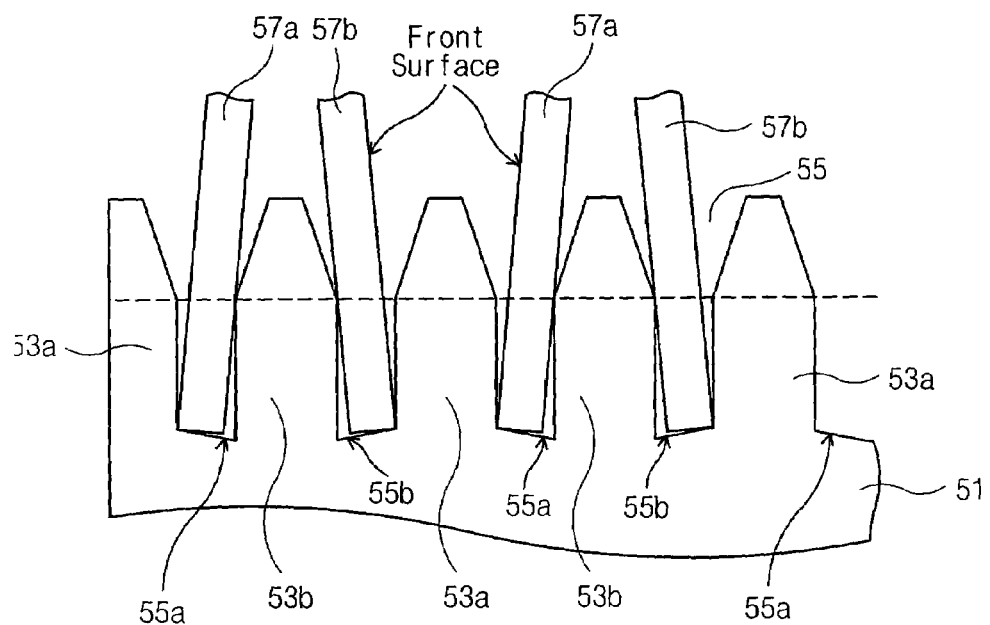
FIG. 9 is a side cross sectional view illustrating a portion of vertical panels of the wafer guide according to an embodiment of the present invention.

FIG. 9 is a cross sectional view illustrating vertical panels of the wafer guide according to an embodiment of the present invention.

Referring to FIG. 9, each of the vertical panels comprises a vertical body panel 51 and a plurality of protrusions extended from a top surface of the body panel 51. Gap regions between the protrusions correspond to slots 55. The protrusions include a second set of protrusions 53a interleaved with a first set of protrusions 53b. Similarly, the slots 55 include a second set of slots interleaved with a first set of slots. Sidewalls of the slots 55, e.g., sidewalls of the protrusions, have vertical lower sidewalls and positive sloped upper sidewalls. Bottom surfaces 55a of the second set of slots have an opposite slope to the bottom surfaces 55b of the first set of slots when viewed from a cross sectional view taken along a plane that is parallel to the vertical panels. Portions where a second set of bottom surfaces 55a are in contact with the sidewalls of the second set of protrusions 53a are higher than portions where a second set of bottom surfaces 55a are in contact with the sidewalls of the first set of protrusions 53b. Thus, a second set of wafers 57a inserted in the second set of slots are inclined toward the first set of protrusions 53b as shown in FIG. 9. Also, portions where a first set of bottom surfaces 55b are in contact with the sidewalls of the second set of protrusions 53a are higher than portions where the first set of bottom surfaces 55b are in contact with the sidewalls of the first set of protrusions 53b. Thus, a first set of wafers 57b inserted in the first set of slots are inclined toward the first set of protrusions 53b as shown in FIG. 9. Accordingly, it is possible to improve a rinsing efficiency or a drying efficiency to the front surfaces of the wafers.

Furthermore, the vertical lower sidewalls may have a convex shape when viewed from a top view, for example, as shown in FIGS. 2 and 3. The bottom surfaces 55a and 55b also may have a surface profile as shown in FIGS. 4 and 5.

Figure 10:
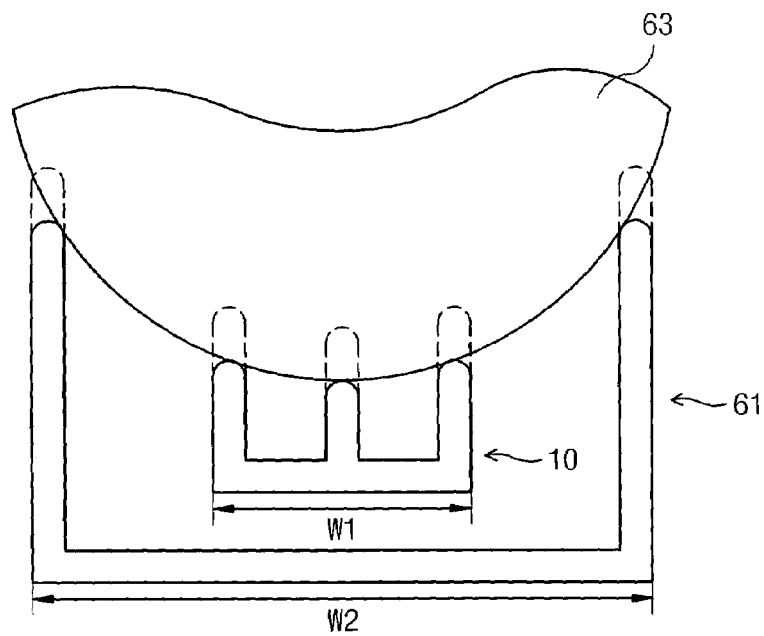
FIG. 10 is a front cross sectional view illustrating the wafer guide according to an embodiment of the present invention.

FIG. 10 is a schematic front cross sectional view illustrating a wafer guide according to an embodiment of the present invention.

Referring to FIG. 10, a wafer guide comprises a main wafer guide 10 having a first width W1 and an auxiliary wafer guide 61 having a second width W2 that is wider than the first width W1. The main wafer guide 10 may have the same configuration as the wafer guides described with reference to FIGS. 1 to 6. The auxiliary wafer guide 61 includes an auxiliary support portion having the second width W2 and a pair of parallel wafer supporters located on both edges of the auxiliary support portion to additionally hold wafers 63 loaded on the main wafer guide 10. A space between the pair of wafer supporters is wider than the width of the main wafer guide 10. Thus, it is possible to maintain substantially uniform spaces between the wafers 63 loaded on the main wafer guide 10.

The auxiliary wafer guide 61 may be simultaneously moved with the main wafer guide 10. The auxiliary wafer guide 61 may be moved independently of the main wafer guide 10.

FIGS. 11 to 15 are schematic views for illustrating a method of using the wafer guide shown in FIG. 10.

Figure 11:
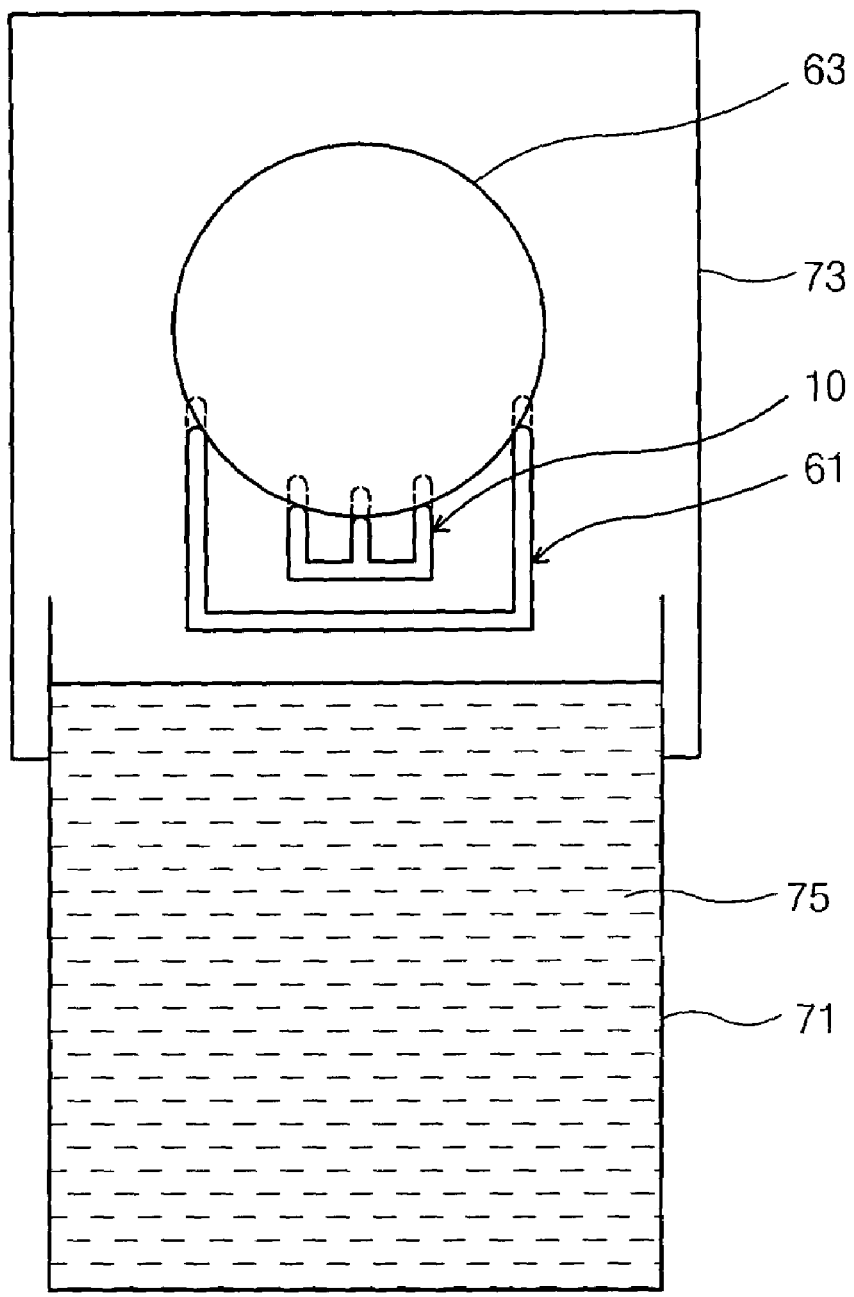
FIGS. 11 to 15 are schematic views for illustrating a method of cleaning and/or drying semiconductor wafers using the wafer guide shown in FIG. 10 according to an embodiment of the present invention.

Referring to FIG. 11, a chamber 73 is located on a wet bath 71 that stores liquid 75 such as a chemical solution or de-ionized water. A bottom of the chamber 73 is open. Thus, the chamber 73 is connected to the wet bath 71. The wafer guide shown in FIG. 10 is located in the chamber 73. A plurality of wafers 63 are loaded on the wafer guide. In this case, the wafers 63 are supported by the auxiliary wafer guide 61 as well as the main wafer guide 10. Thus, upper portions of the wafers 63 as well as lower portions thereof are separated from each other by a substantially uniform distance.

Figure 12:
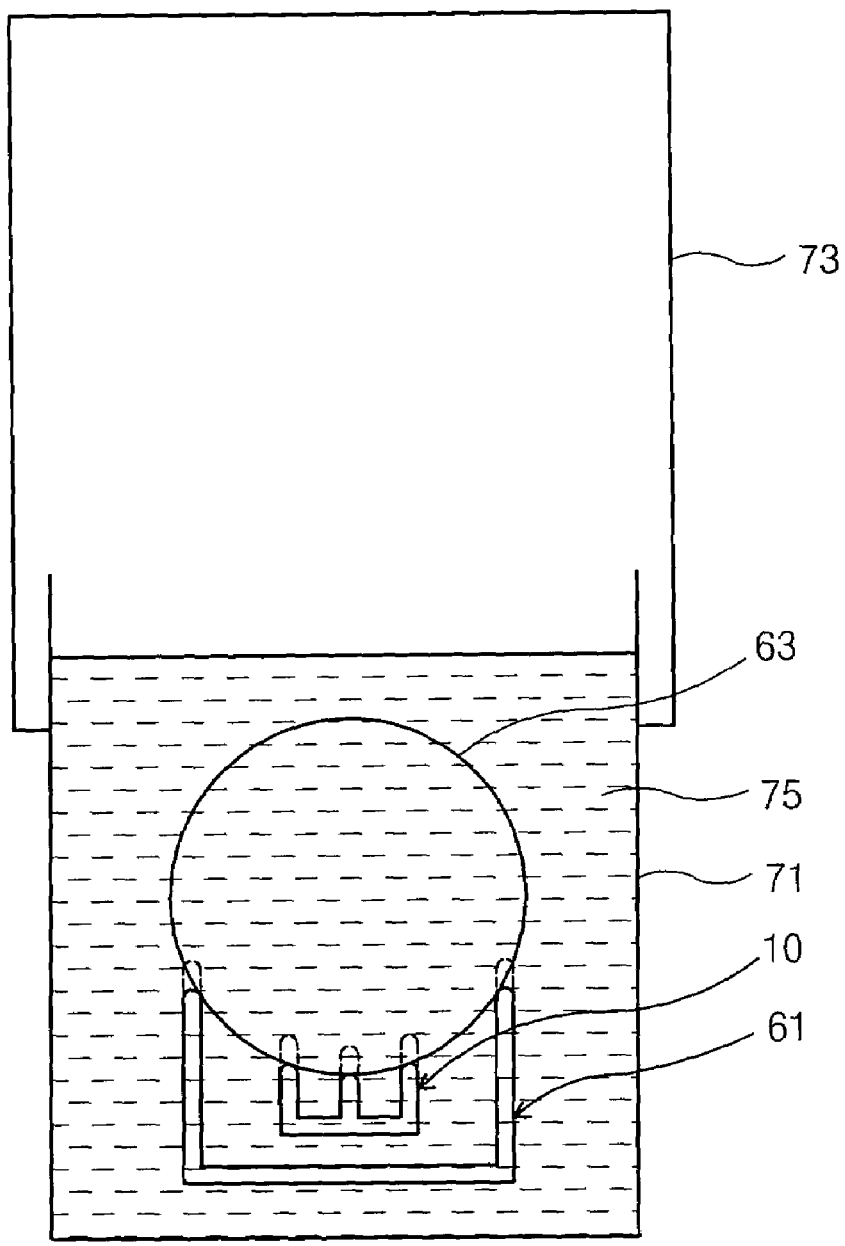

Referring to FIG. 12, the wafer guide descends downward, thereby dipping the wafers 63 into the liquid 75. In the event that the liquid 75 is a cleaning solution, such as a chemical solution, the wafers 63 are cleaned. Alternatively, in the event that the liquid 75 is de-ionized water (DI water), the wafers 63 are rinsed. The cleaning process and the rinse process may be repeatedly performed in the wet bath 71.

Figure 13:
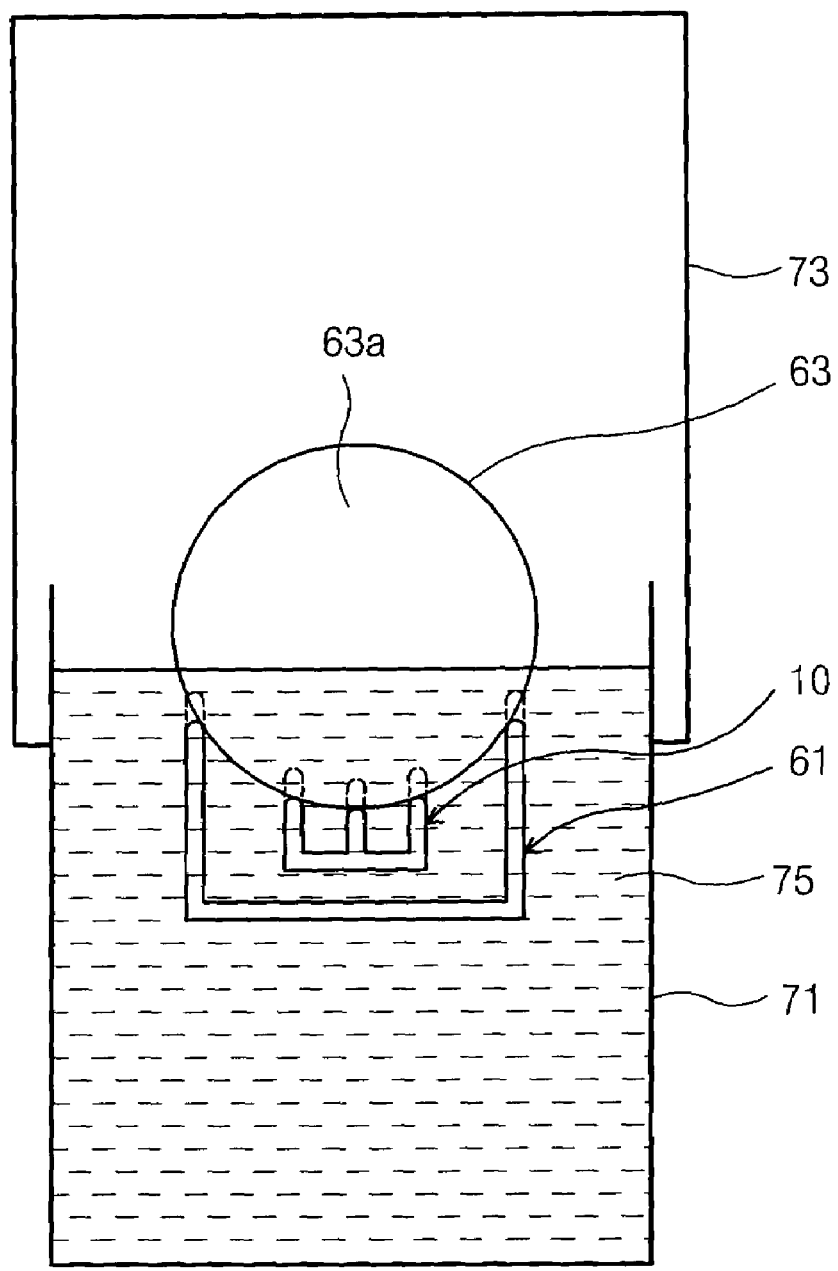

Referring to FIG. 13, a drying gas is introduced into the chamber 73 after completing the rinse process. The wafer guide is lifted up to expose upper portions 63a of the wafers 63. The auxiliary wafer guide 61 is not exposed to the air over the DI water 75, during introduction of the dry gas. Spaces between the exposed upper portions 63a maintain a substantially uniform distance due to the auxiliary wafer guide 61. The DI water existing on the exposed upper portions 63a can be efficiently removed.

Figure 14:
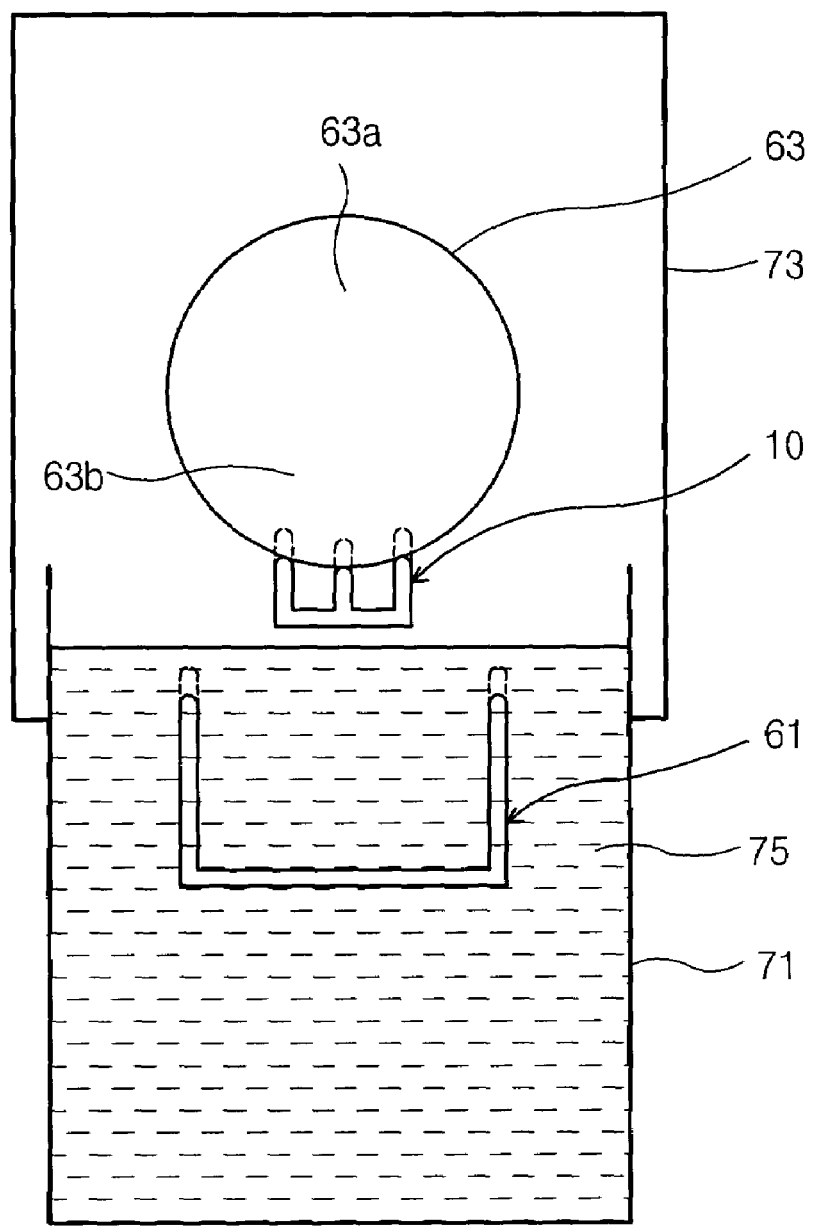

Referring to FIG. 14, the main wafer guide 10 is lifted up to completely expose lower portions 63b of the wafers 63 after drying the upper portions 63a of the wafers. While free of the auxiliary wafer guide 61, the wafers 63 may lean. However, the spaces between the lower portions 63b of the wafers may maintain a substantially uniform distance due to the main wafer guide 10, even though the wafers 63 are inclined. Thus, the DI water existing on the exposed lower portions 63b is also efficiently removed.

Figure 15:
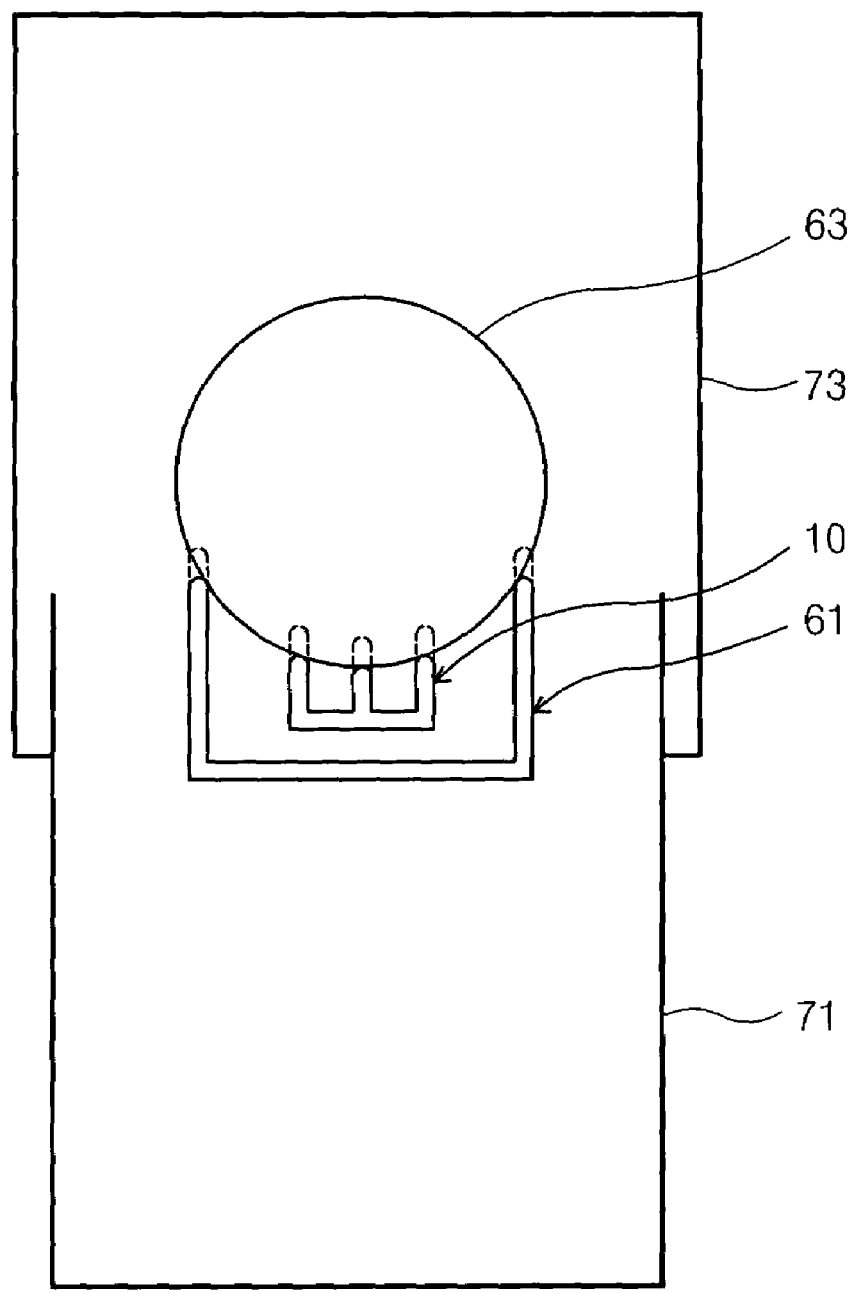

Referring to FIG. 15, the DI water 75 in the wet bath 71 is drained. Accordingly, the auxiliary wafer guide 61 is exposed, and the drying gas introduced into the chamber 73 dries the exposed auxiliary wafer guide 61.

The auxiliary wafer guide 61 may be lifted up to additionally support the wafers 63. A purge gas, such as a nitrogen gas, may be additionally introduced into the chamber 73.

Figure 21:
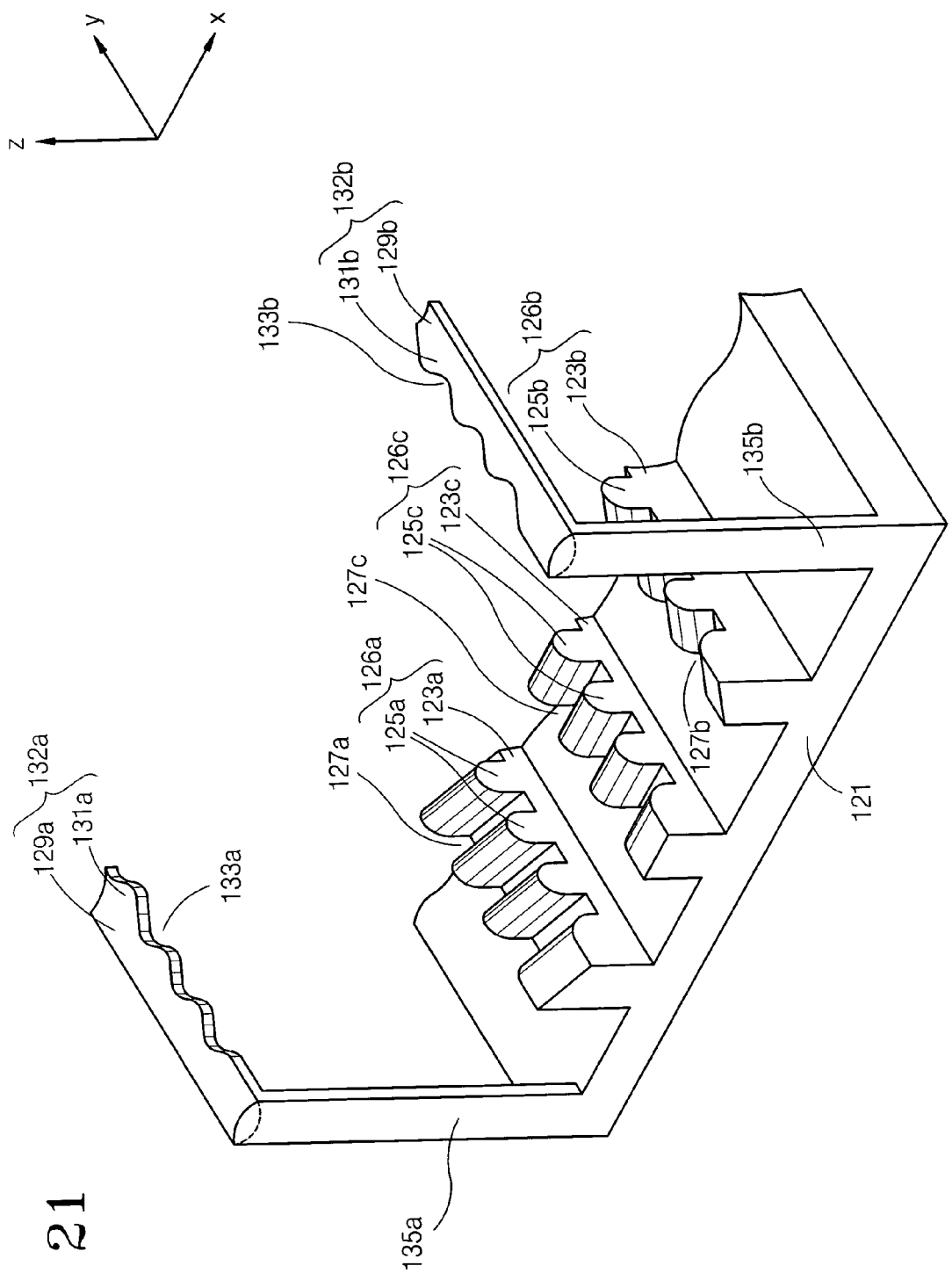
FIG. 21 is a perspective view of the wafer guide according to an embodiment of the present invention.

FIG. 21 is a perspective view for illustrating a wafer guide having a fixed auxiliary wafer guide.

Referring to FIG. 21, a first wafer supporter 132a and a second wafer supporter 132b are located on both edges of a support panel 121 respectively. The support panel 121 is parallel with an x-y plane. The first wafer supporter 132a and the second wafer supporter 132b are disposed to be parallel with a y-axis. The support panel 121 is connected to a pair of first vertical bars 135a extended from both ends of the first wafer supporter 132a. The first wafer supporter 132a is fixed to the support panel 121 by the first vertical bars 135a. Similarly, the second wafer supporter 132b is fixed to the support panel 121 by a pair of second vertical bars 135b. The first wafer supporter 132a comprises a first horizontal body 129a having a pair of parallel sidewalls and a plurality of first protrusions 131a protruded from one of the parallel sidewalls. The first protrusions 131a define a plurality of first lumbar regions 133a. The second wafer supporter 132b comprises a second horizontal body 129b having a pair of parallel sidewalls and a plurality of second protrusions 131b protruded from one of the parallel sidewalls. The second protrusions 131b define a plurality of second lumbar regions 133b. The first lumbar regions 133a and the second lumbar regions 133b act as auxiliary slots holding a plurality of wafers.

Three vertical panels, which are parallel with the y-axis, are attached on the support panel 121 between the first wafer supporter 132a and the second wafer supporter 132b. The vertical panels comprise a central panel 126c passing through a central portion of the support panel 121, a first vertical panel 126a located between the central panel 126c and the first wafer supporter 132a, and a second vertical panel 126b located between the central panel 126c and the second wafer supporter 132b. The central panel 126c as well as the first vertical panel 126a and the second vertical panel 126b may have a configuration as shown in FIGS. 1 to 5. That is, the first vertical panel 126a comprises a first vertical body panel 123a and a plurality of first protrusions 125a extended from a top surface of the first vertical body panel 123a. The first protrusions 125a define a plurality of first slots 127a. Similarly, the second vertical panel 126b comprises a second vertical body panel 123b and a plurality of second protrusions 125b extended from a top surface of the second vertical body panel 123b. The second protrusions 125b define a plurality of second slots 127b. Also, the central panel 126c comprises a central body panel 123c and a plurality of central protrusions 125c extended from a top surface of the central body panel 123c. The central protrusions 125c define a plurality of central slots 127c.

The central panel 126c as well as the first vertical panel 126a and the second vertical panel 126b may be supported by another support panel (not shown) separated from the support panel 121. In this case, the first vertical panel 126a and the second vertical panel 126b, the central panel 126c, and the other support panel comprise the main wafer guide 10 of FIG. 10. The first wafer supporter 132a and the second wafer supporter 132b, the first vertical bar 135a and the second vertical bar 135b, and the support panel 121 comprise the auxiliary wafer guide 61 of FIG. 10.

Figure 22:
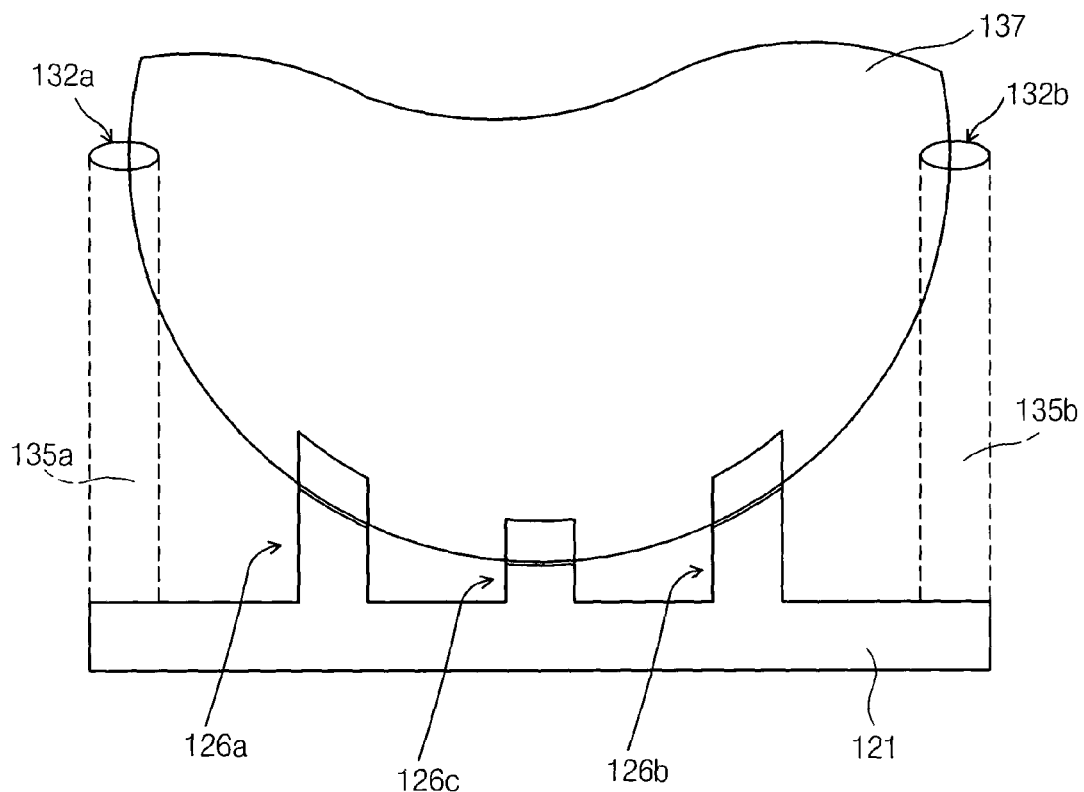
FIG. 22 is a front cross sectional view of the wafer guide shown in FIG. 21.

FIG. 22 is a front view illustrating the wafer guide of FIG. 21 as well as wafers loaded on the wafer guide.

Referring to FIG. 22, the first wafer supporter 132a and the second wafer supporter 132b additionally hold edges of wafers 137 loaded on the main wafer guide, thereby keeping the spaces between the wafers 137 substantially uniform. The main wafer guide may comprise the support panel 121 and the first vertical panel 126a and the second vertical panel 126b.

The first wafer supporter 132a and the second wafer supporter 132b have a streamlined shape when viewed from a cross sectional view that is parallel with the x-z plane of FIG. 21. Accordingly, it allows a drying gas, which is supplied into regions between the wafers 137 along the x-axis direction of FIG. 21, to smoothly flow without forming a whirlpool.

Figure 23:
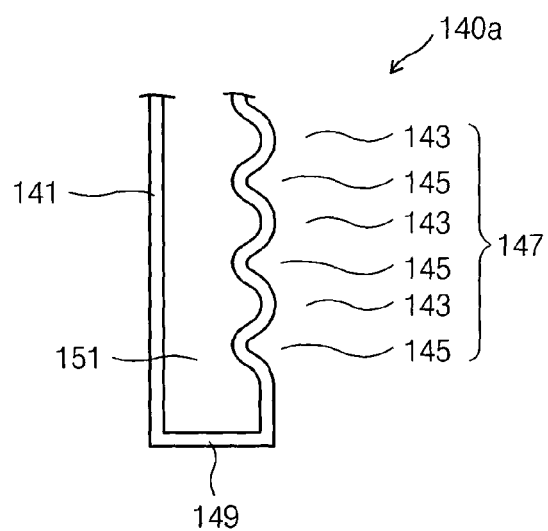
FIG. 23 is a top view illustrating an embodiment of the auxiliary wafer guide shown in FIG. 21.

FIG. 23 is a top view illustrating an embodiment of the first wafer supporter 132a or the second wafer supporter 132b shown in FIG. 21.

Referring to FIG. 23, a wafer supporter 140a comprises a pair of side bars 141 and 147, a front bar 149 connecting front ends of the side bars 141 and 147 with each other, and a rear bar (not shown) connecting rear ends of the side bars 141 and 147 with each other. One of the side bars 141 and 147 (for example, 147 of FIG. 23) has a bent shape. Thus, the bent side bar 147 has a plurality of protrusions 143 that define a plurality of lumbar regions 145. The lumbar regions 145 hold edges of the wafers 137 shown in FIG. 22. As a result, the side bars 141 and 147, the front bar 149 and the rear bar comprise a closed loop that surrounds a space 151.

Figure 16:
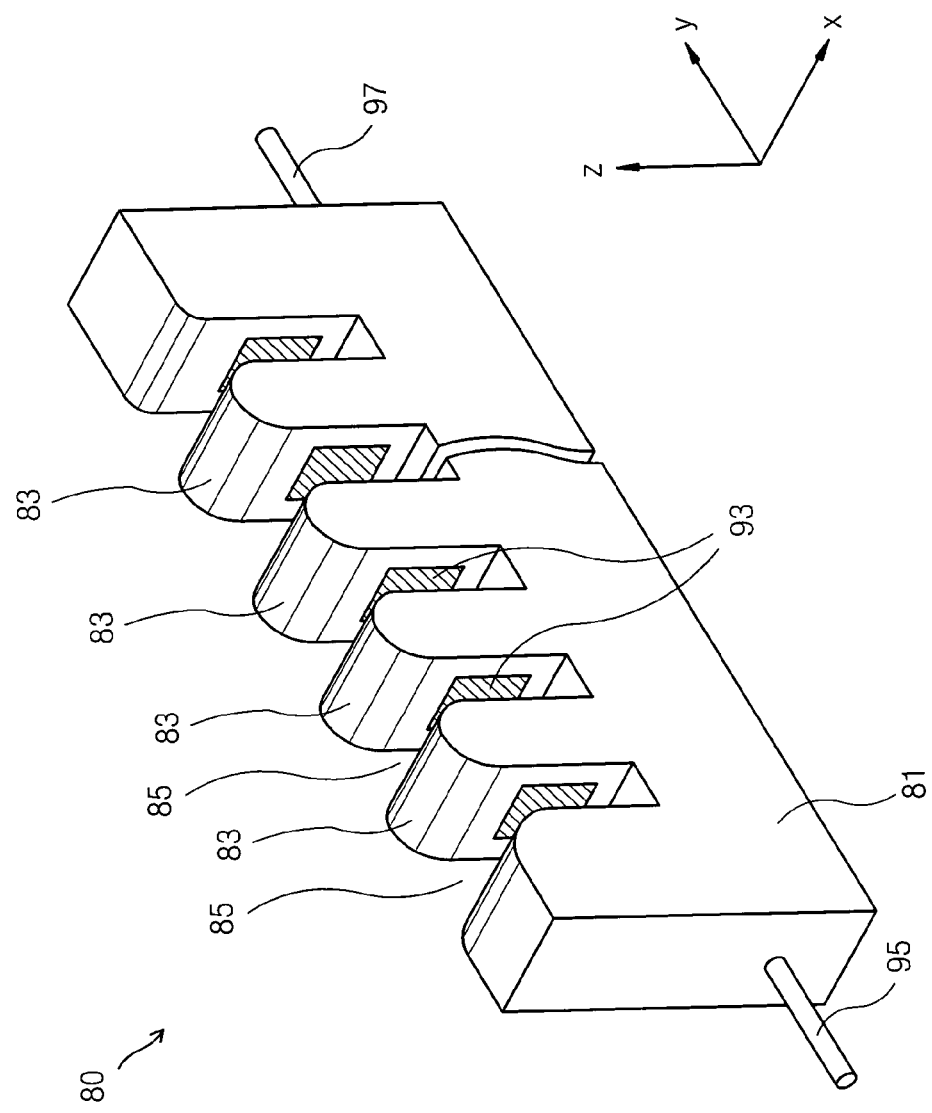
FIG. 16 is a perspective view illustrating a vertical panel unit of the wafer guide according to an embodiment of the present invention.
Figure 17:
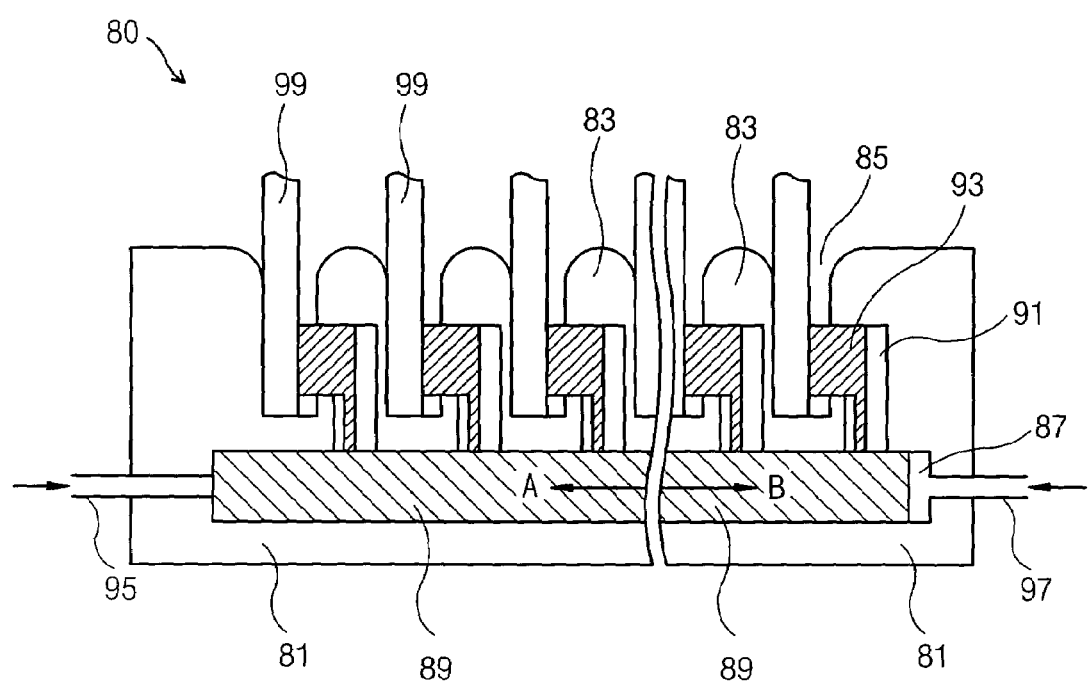
FIG. 17 is a cross sectional view of the vertical panel unit taken along the y-z plane of FIG. 16.

FIG. 16 is a perspective view illustrating a vertical panel unit of a wafer guide according to an embodiment of the present invention, and FIG. 17 is a cross sectional view of the vertical panel unit taken along a y-z plane of FIG. 16.

Referring to FIGS. 16 and 17, the vertical panel unit 80 may be installed instead of the central panel 6c shown in FIG. 1. In addition, the vertical panel unit 80 may be installed instead of the first vertical panel 6a and the second vertical panel 6b shown in FIG. 1. The vertical panel unit 80 comprises a vertical body panel 81 and a plurality of protrusions 83 extended from a top surface of the body panel 81. The body panel 81 is parallel with a y-z plane, and the protrusions 83 are arrayed in a line along a y-axis. Gap regions 85 between the protrusions 83 serve as slots in which wafers 99 are inserted. Preferably, lower sidewalls of the protrusions 83, e.g., lower sidewalls of the slots 85, have a vertical profile.

A cylinder 87, which is parallel with the y-axis, is provided in the body panel 81. A piston 89 is disposed in the cylinder 87. The ends of the cylinder 87 are connected to a first fluid inlet conduit 95 and a second fluid inlet conduit 97 respectively. Thus, in the event that fluid such as a liquid or a gas is injected into the cylinder 87 through the first fluid inlet conduit 95, the piston 89 moves toward a direction "B", e.g., toward the second fluid inlet conduit 97. Alternatively, in the event that the fluid is injected into the cylinder 87 through the second fluid inlet conduit 97, the piston 89 moves toward a direction "A", e.g., toward the first fluid inlet conduit 95.

A plurality of pad cylinders 91 are provided inside the protrusions 83. A pad 93 is disposed in each of the pad cylinders 91 respectively. The pads 93 are physically connected to the piston 89 to simultaneously move with the piston 89. Accordingly, in the event that the fluid is injected through the second fluid inlet conduit 97, the piston 89 moves toward the first fluid inlet conduit 95 and each pad 93 is protruded from a respective sidewall of the protrusions 83. As a result, the wafers 99 loaded in the slots 85 are squeezed and held vertically. Therefore, the spaces between the wafers 99 have a substantially uniform distance.

An operation for loading the wafers 99 on the vertical panel unit 80 or for unloading the wafers 99 from the vertical panel unit 80 is achieved after introducing the fluid into the first fluid inlet conduit 95 to move the pads 93 inward, e.g., into the sidewalls of the protrusions 83.

The cylinder 87, the piston 89, the first fluid inlet conduit 95 and the second fluid inlet conduit 97, the pad cylinders 91 and the pads 93 comprise a wafer alignment tool.

Figure 18:
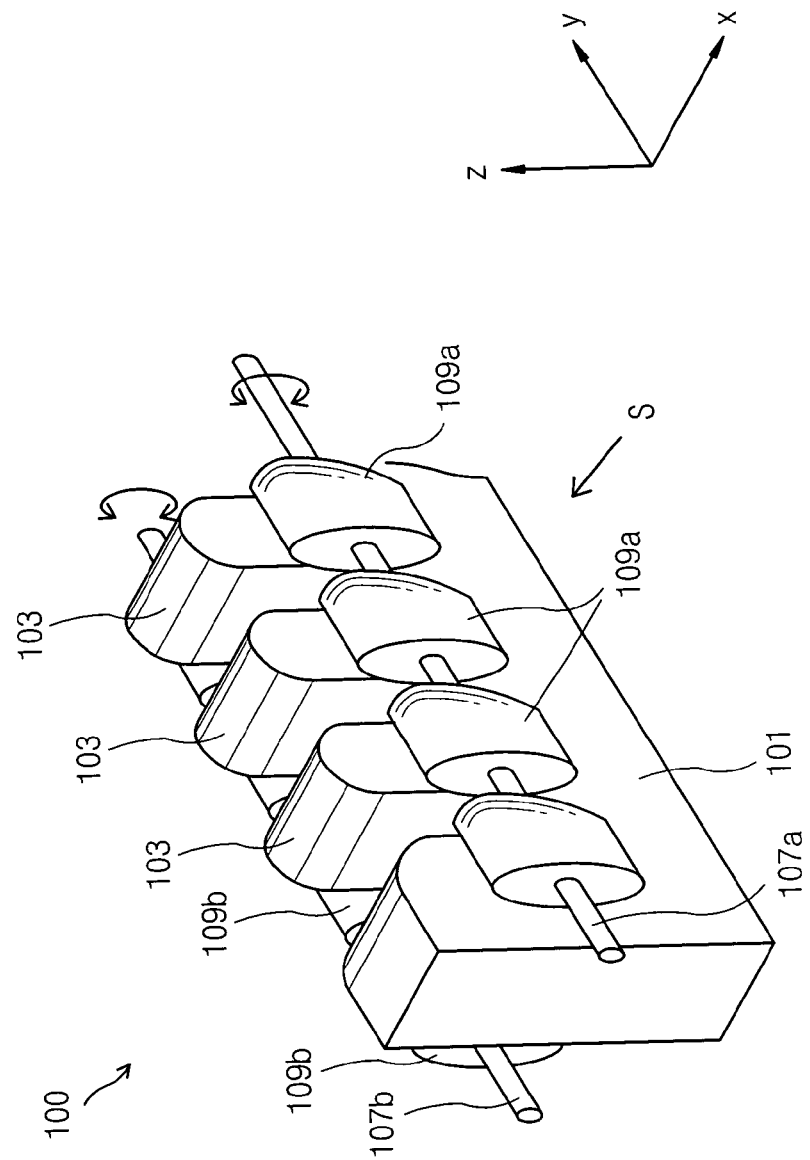
FIG. 18 is a perspective view illustrating a portion of vertical panel units of the wafer guide according to an embodiment of the present invention.
Figure 19:
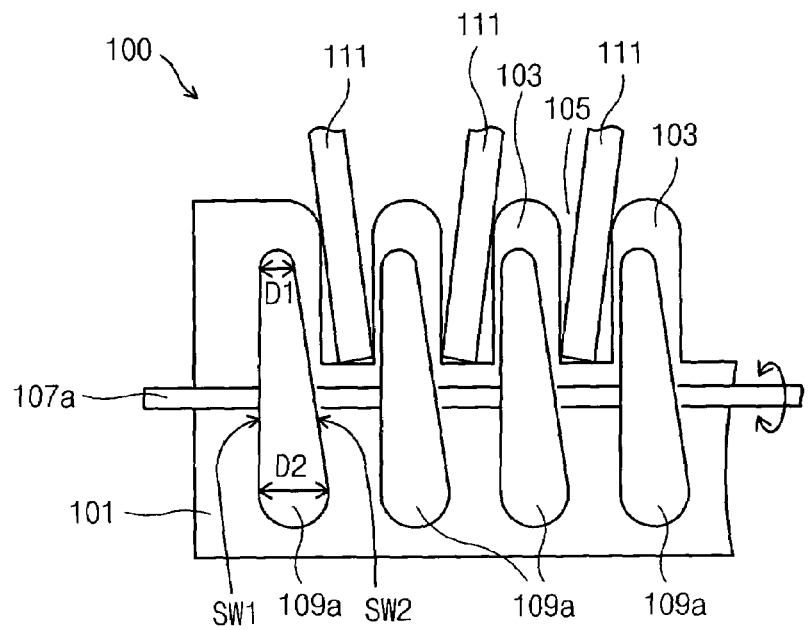
FIG. 19 is a side view for illustrating a method of loading wafers into the slots of FIG. 18 or unloading the wafers from the slots according to an embodiment of the present invention.
Figure 20:
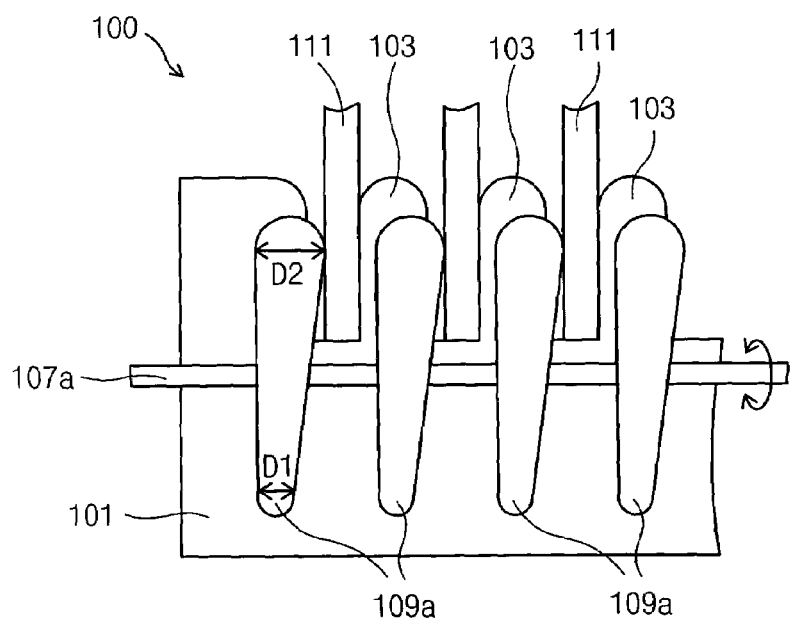
FIG. 20 is a side view for illustrating a method of arranging the wafers in the slots according to an embodiment of the present invention.

FIG. 18 is a perspective view illustrating an embodiment of the vertical panel unit shown in FIG. 17. FIG. 19 is a side view illustrating a method of loading or unloading wafers using the vertical panel unit shown in FIG. 18, and FIG. 20 is a side view for illustrating a method of aligning wafers using the vertical panel unit shown in FIG. 18. FIGS. 19 and 20 are side views shown toward a direction "S" indicated in FIG. 18.

Referring to FIGS. 18, 19 and 20, the vertical panel unit 100 may be installed instead of the central panel 6c shown in FIG. 1. In addition, the vertical panel unit 100 may also be installed instead of the first vertical panel 6a and the second vertical panel 6b shown in FIG. 1. The vertical panel unit 100 comprises a vertical body panel 101 and a plurality of protrusions 103 extended from a surface of the body panel 101. The body panel 101 is parallel with a y-z plane of FIG. 18, the protrusions 103 are arrayed in a line along the y-axis. Gap regions 105 between the protrusions 103 correspond to slots in which wafers 111 are inserted. It is preferable that lower sidewalls of the protrusions 103, e.g., lower sidewalls of the slots 105, have a vertical profile. The body panel 101 and the protrusions 103 comprise a vertical panel.

A first rotational axis 107a and a second rotational axis 107b are installed at both sides of the vertical panel respectively. The first rotational axis 107a penetrates central portions of a first group of rollers 109a, and the second rotational axis 107b penetrates central portions of a second group of rollers 109b. The first group of rollers 109a and the second groups of rollers 109b are located at both sides of the protrusions 103 respectively. The rollers 109a and 109b are arrayed to have the same pitch as the protrusions 103. Also, the rollers 109a and 109b are fixed to the rotational axes 107a and 107b, thereby simultaneously rotating with the rotational axes 107a and 107b. The rotational axes 107a and 107b and the rollers 109a and 109b comprise a wafer alignment tool.

Each of the rollers 109a and 109b includes a first edge having a first thickness D1 and a second edge having a second thickness D2 that is greater than the first thickness D1. Accordingly, each of the rollers 109a and 109b has at least one sloped sidewall. First sidewalls SW1 of the rollers have a vertical profile, and second sidewalls SW2 opposite the first sidewalls SW1 have a sloped profile. That is to say, normal lines to the first sidewalls SW1 are parallel with the rotational axes 109a and 109b, and normal lines to the second sidewalls SW2 have a predetermined angle with respect to the rotational axes 109a and 109b. Thus, in the event that the first and second rotational axes 107a and 107b are rotated so that the first edges are upwardly arrayed as shown in FIG. 19, it allows the wafers 111 to be loaded or unloaded. In the event that the first and second rotational axes 107a and 107b are rotated so that the second edges are upwardly arrayed as shown in FIG. 20, actual widths of the slots 105 are reduced due to the second edges. Therefore, the wafers 111 in the slots 105 are squeezed and held substantially vertically. As a result, spaces between the wafers 111 have a substantially uniform distance.

Although not shown in the figures, all of the first and second sidewalls SW1 and SW2 may have sloped profiles.

As described above, according to the present invention, it is possible to reduce contact areas between the wafer guide and the wafers. Thus, a drying efficiency can be improved. In addition, distances between the wafers can be uniformly adjusted using the auxiliary wafer guide or the wafer alignment tool. Therefore, the drying efficiency can be improved.

What is claimed is:

1. A wafer guide comprising:
   a support panel; and
   at least three vertical panels attached on one surface of the support panel, wherein each of the vertical panels has a vertical body panel and a plurality of protrusions extended from a top surface of the vertical body panel to define a plurality of slots therebetween, the protrusions having a first set of protrusions interleaved with a second set of protrusions, the plurality of protrusions each comprising vertical sidewall portions extending from respective vertical body panels and positive sloped sidewall portions extending from the vertical sidewalls, the vertical sidewalls of the second set of protrusions being lower or higher than the vertical sidewalls of the first set of protrusions.

2. The wafer guide of claim 1, wherein the vertical sidewalls have a convex shape when viewed from a top view.

3. The wafer guide of claim 1, wherein each of the plurality of slots has a bottom surface that exhibits a convex shape when viewed from a cross sectional view crossing the vertical body panel and passing through the slot.

4. The wafer guide of claim 3, wherein the vertical panels comprise a first vertical panel and a second vertical panel attached on both edges of the support panel respectively and a central panel located between the first vertical panel and second vertical panel.

5. The wafer guide of claim 3, wherein each bottom surface of the plurality of slots in the central panel has an asymmetrical profile with respect to a plane that is parallel with the central panel and passes through a central portion of the central panel.

* * * * *